United States Patent [19]

Cannon

[11] 4,445,047
[45] Apr. 24, 1984

[54] LOAD BANK

[76] Inventor: Charles S. Cannon, 8070 Johnson Rd., Palmetto, Ga. 30268

[21] Appl. No.: 477,627

[22] Filed: Mar. 22, 1983

[51] Int. Cl.³ .................... G01R 31/00; G01R 31/02
[52] U.S. Cl. ............................ 307/31; 324/158 MG; 322/99; 361/386
[58] Field of Search ........................... 307/31, 34, 36; 324/158 MG; 322/99, 7, 8; 361/386, 388

[56] References Cited

U.S. PATENT DOCUMENTS 4,344,032  8/1982  Anlauf ..................... 324/158 MG
4,379,990  4/1983  Sievers et al. ..................... 322/99

Primary Examiner—E. A. Goldberg
Assistant Examiner—Derek Jennings
Attorney, Agent, or Firm—Thomas & Kennedy

[57] ABSTRACT

A portable load bank for loading a generator during a generator test has a set of low resistance coils mounted side by side in a housing and air cooled by a bank of fans. A switching network is provided for testing generators at three discrete load levels. An interlock circuit is provided for safety.

12 Claims, 4 Drawing Figures

LOAD BANK

Technical Field

This invention relates generally to load banks, and particularly to load banks used in loading generators for testing.

Background of the Invention

Electrically generators are sometimes used in applications which mandate that they be frequently tested. For example, generators are commonly provided at airports for powering the electrical systems of aircraft while they are on the ground with their own power plants and generators shut down. These ground based generators are typically mounted upon trucks powered by diesel engines that may be driven to the planes, or located at passenger embarkation gates where the planes are frequently parked. Just prior to engine shut down of an aircraft that has landed and taxied to a gate the electrical systems of the aircraft is switched from aircraft generated power to land based generated power. This is typically done by a worker connecting a cable to an externally accessible plug located on the aircraft and to a ground based generator plug. For larger aircraft a.c. generators are used while for smaller craft d.c. generators are employed.

Airport based generators must normally be checked at regular intervals to lessen the chances for defective generators damaging the electrical systems aboard the aircraft. For example, it is a common occurrance for generator voltage regulators to degrade after a relatively short period of time which, if allowed to progress, can early produce such damage. To conduct a test of a generator it is necessary to place a load on it that must carry a substantial amount of current. For example, large aircraft ground generators are typically 48 KW, 3 phase, 400 cycle, 200 VAC generators. To provide a suitable test load for such load banks have heretofore had to be relatively large, bulky and heavy which has made them unwieldly. This is quite a disadvantage since it is not economically feasible to provide built-in test equipment for each generator since a large airport may have over a hundred individual generators. For example, one commercially available load bank has a very long strand of wire wound on a heavy bank of ceramic insulators. A relatively lightweight, portable load bank is available but it employs a water cooled system which produces large pools of standing water on airport ramps whenever a generator is tested. Another limitation of the prior art portable load banks has been their lack of safety interlock circuitry.

Accordingly, it is seen that a need remains for the provision of a portable, relatively lightweight, compact load bank that may be safely used in loading a generator during generator testing. It is to the provision of such a load bank that the present invention is primarily directed.

Summary of the Invention

In one form of the invention, a portable load bank for loading a generator during a generator test has a housing, an electrical plug mounted to the housing having a set of terminals, and a plurality of electrically conductive coils mounted side by side within the housing in series circuit. The load bank also has switch means for electrically connecting the plurality of the coils across at least two of the plug terminals, and electrically powered fan means coupled with the plug for circulating air through the housing and cooling the plurality of coils when conducting current while electrically connected across the two plug terminals by the switch means.

In another form of the invention, a compact, lightweight, portable load bank for loading an a.c. generator during a generator test has a housing to which first and second terminals are mounted. Low resistance conductive means are connected across the first and second terminals through a silicon controlled rectifier. Switch means are included for gating the silicon controlled rectifier on to cause the load bank to operate on a half duty cycle by drawing current through the low resistance conductive means during one-half cycles of the a.c. generator voltage output.

In yet another form of the invention a load bank for loading an a.c. generator during a generator test has a housing to which a plug is mounted having first, second and third terminals. A first low resistance conductor is mounted within the housing and electrically connected with the first terminal, a second low resistance conductor is mounted within the housing and electrically connected with the second terminal, and a third low resistance conductor is mounted within the housing and electrically connected with third terminal. Switching network means are provided for selectively connecting together the first and second conductors through first unidirectional current carrying means, and the second and third conductors through a second unidirectional current carrying means, and the first and third conductors through a third unidirectional current carrying means. So constructed, the generator may be loaded by the load bank at three discreet load levels with the full load being on a full duty cycle basis.

Detailed Description

Figure 1:
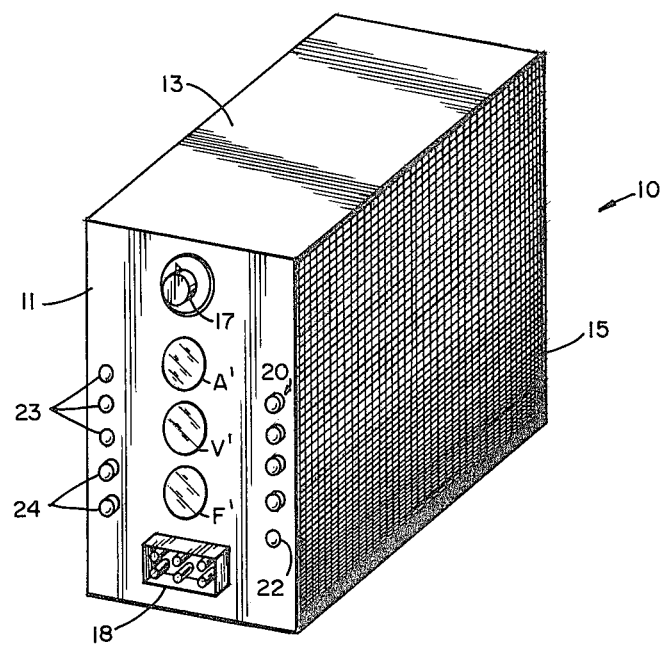
FIG. 1 is a perspective view of a load bank embodying principles of the present invention.
Figure 2:
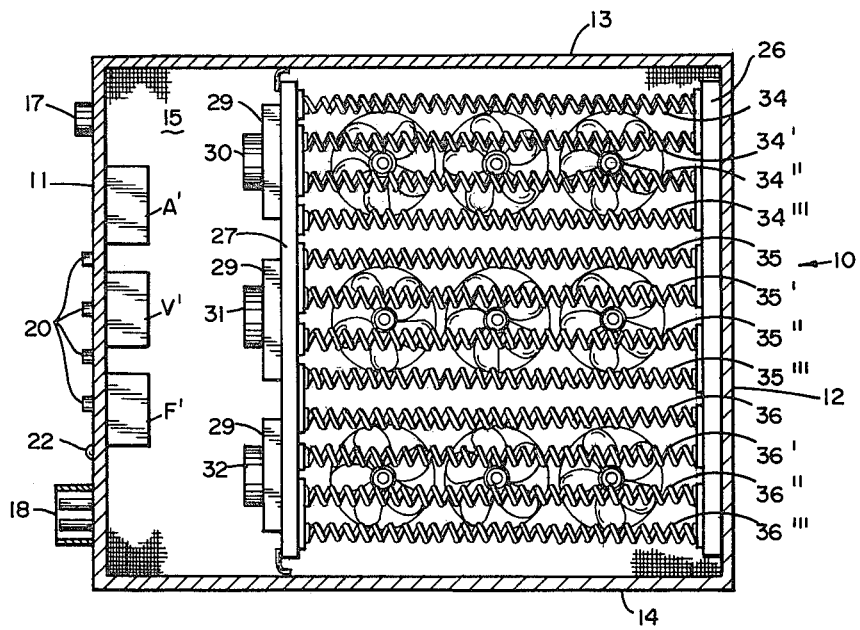
FIG. 2 is a transverse cross-sectional view of the load bank illustrated in FIG. 1 revealing internal components thereof.

With reference next to the drawing, there is shown in FIGS. 1 and 2 a portable load bank 10 having a housing that includes a front panel 11, a rear panel 12, a top 13, a bottom 14 and two side grills 15 with the full details of one of the grills not shown in FIG. 2 for purposes of clarity. To the front panel 11 of the housing is mounted an ammeter A', a voltmeter V' and a frequency meter F'. A rotary switch 17 is also mounted to the front panel as is a plug 18 which has six terminals A, B, C, E, F and N. Four test pins 20 are mounted in a vertical row to the front panel 11 which may be used in taking precise, digital voltage readings while an interlock light 22 is mounted on the panel beneath the row of test pins. Three other lamps 23 are mounted to the front panel to indicate the presence of voltage across terminals A, B, and C of the load bank plug 18. Two additional pins 24 are mounted to the panel which may be used for testing proper phase and ground connections.

With particular reference to FIG. 2 two dialectric mounting boards 26 and 27 are shown mounted within the housing which are preferably formed of fiberglass for good heat resistance. Three heat sinks 29 are mounted to the mounting board 27 to which three silicon controlled rectifiers (SCRs) 30, 31 and 32 are respectively mounted. These SCRs are mounted to an electrical circuit as hereinafter described. For purposes of clarity much of the electrical circuitry itself is not illustrated in FIG. 2.

Figure 3:
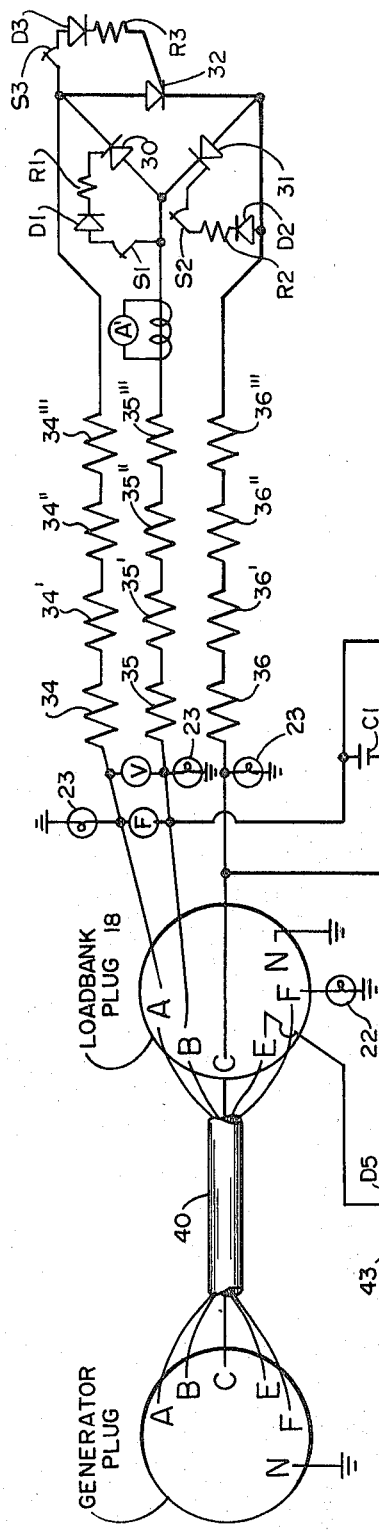
FIG. 3 is a circuit diagram of the load bank illustrated in FIGS. 1 and 2.

The load bank also has three groups of four low resistance, nicrome coils each mounted within the housing between the mounting boards 26 and 27. The first group includes coils 34, 34', 34" and 34'" while the second group includes coils 35, 35', 35" and 35'". The third group is comprised of coils 36, 36', 36" and 36'". Some of the coils are seen to be electrically coupled together by metallic mounting blocks that are mounted directly to the mounting boards 26 and 27 to which blocks the ends of the coils are secured. For purposes of clarity, however, each of these metallic connectors have not been designated with reference numerals. FIGS. 2 and 3 however do show that coils 34–34'" are connected in series circuit as are coils 35–35'" and 36–36'". A bank of nine electrically powered fans is also mounted within the housing for circulating air through the grills and housing in cooling the various coils. These fans are mounted on unshown mounting boards between the coils and one of the grills 15.

With reference next to FIG. 3, the load bank circuitry is seen to include the load bank plug 18 which has the six terminals A, B, C, E, F and N that are adapted to be connected by a cable 40 to a generator plug with terminals of the same lettered identification. The four low resistance coils 34–34'" are seen to be connected in series circuit with terminal A while the four coils 35–35'" are serially connected with terminal B. Similarily, the four coils 36–36'" are serially connected with terminal C. The three lamps 23 are seen to be respectively coupled across terminal A and ground, terminals B and C, and terminal C in ground. The voltmeter V' and frequency meter F' are each connected across terminals A and B while the ammeter A' is inductively coupled with terminal B. The group of coils 34–34'" is electrically connected in series circuit with the group of coils 35–35'" through the SCR 30. The group of coils 35–35'" is serially connected to the group of coils 36–36'" through the SCR 31. In addition, the group of coils 36–36'" is connected in series circuit with the group of coils 34 coils 34–34'" through the SCR 32. The SCR 30 may be gated on by the closure of a switch S1 which couples the gate of the rectifier to the coil 35'" through a diode D1 and a resistor R1. The SCR 31 may be gated on by closure of a switch S2 which connects the gate of the rectifier to the coil 36'" through a diode D2 and a resistor R2. Similarly, the SCR 32 may be gated on by closure of switch S3 which connects the rectifier gate with the coil 34'" through a diode D3 and resistor R3. The circuit is further seen to include the nine fans f which are connected across terminals B and C through a rectifing diode D4 and a voltage build-up capacitor C1.

An interlock circuit, generally designated at 43, is provided which includes a step-down transformer 44 having a primary coil connected between plug terminal C and ground and a secondary coil connected by a full wave bridge rectifier 45 formed of four diodes D2 across plug terminal E and ground. A filter capacitor C2 is provided for improved rectification.

One set of values for the discreet components of the just described circuit is provided below in Table 1.

TABLE 1

| Resistors | |
|---|---|
| 34—34'" | ¼ ohm (each) |
| 35—35'" | ¼ ohm (each) |
| 36—36'" | ¼ ohm (each) |
| R1 | 1K ohms |
| R2 | 1K ohms |
| R3 | 1K ohms |
| SCRs | |
| 30 | 210 amps rating |
| 31 | 210 amps rating |
| 32 | 210 amps rating |
| Capacitors | |
| C1 | 500 MF |
| C2 | 3.3 MF |
| Diodes | |
| D1 | 2 amps |
| D2 | 2 amps |
| D3 | 2 amps |
| D4 | 5 amps |
| D5 | 15 amps (each) |
| Fans | |
| f | 120 CFM 48 VDC (each) |

In operation the load bank plug is electrically coupled with the generator plug by cable 40 with the selector switch 17 in an "off" position. This coupling presents 115 VAC across terminal C and ground which is stepped down by transformer 44 to 28 VAC across the full wave bridge rectifier 45. In this manner 28 VDC is presented across terminals C and N where N is connected with ground from both the load bank plug and the generator plug. As a result 28 VDC appears across terminals E and N of the generator plug. With a.c. generator commonly in providing aircraft ground power, this provides an indication that the load bank is safely connected by the cable with the generator plug. Were 28 VDC not to be impressed across terminals E and N of the generator plug, an automatic disconnect action would be initiated since the absence of such a feed-back voltage could indicate the presence of a fault in the cable 40 or a faulty plug to cable connection. At plug connection the bank of fans F also become energized. They are seen to be powered by a potential of 48 VDC which is provided by rectification of the a.c. voltage across terminals B and N due to the presence of the rectifying diode D4 and the waveform smoothing capacitor C1.

Next, the selector switch 17 is rotated causing the switch S1 to close. The closing of this switch gates the SCR 30 on whereupon a.c. current will commence to flow through the group of coils 34–34'" and the group of coils 35–35'" on a half-duty cycle basis since current conduction will only occur during one polarity of the voltage output of the generator. At this time the voltmeter should read 200 volts, the ammeter 50 amps and the frequency meter 400 hertz. If this condition has been successfully met the selector switch 17 is again rotated causing switch S2 also to close while leaving switch S1 in a closed position. The closing of switch S2 gates the SCR 31 on whereupon current will also flow serially through the group of conductors 36–36'" and 35–35'". At this time the frequency and voltmeter indications should remain the same while the ammeter reading should increase to approximately 85 amps. At this time it should be appreciated that almost twice the current if flowing on a half-duty cycle basis for each phase through the group of resistance coils 35–35'" relative to the flow through either of the other two groups of coils. With the proper current reading having been observed on the ammeter the selector switch 17 is rotated again closing switch S3 while leaving switches S1 and S2 also in their closed positions. The closing of the switch S3 gates the SCR 32 on thereby serially connecting the group of coils 34–34''' with the group 36–36'''. At this point additional current will flow on a half-duty cycle basis for one phase through the circuit provided by the groups of coils 34–34''' and 36–36'''. A uniform current flow rate on a full duty cycle basis will thus now occur through each of the three groups of coils, thereby providing a smooth full load on the generator, and the ammeter should indicate approximately 115 amps.

In this manner the generator has been tested with an incrementally increasing load which is important since the impression of a full load initially across a generator will frequently cause the engine powering the generator to stall due to the presence of carbon build-up. With an incrementally increasing loading with each step being conducted for some fifteen or twenty minutes, the carbon tends to burn out thereby enabling the test to be successfully completed.

Figure 4:
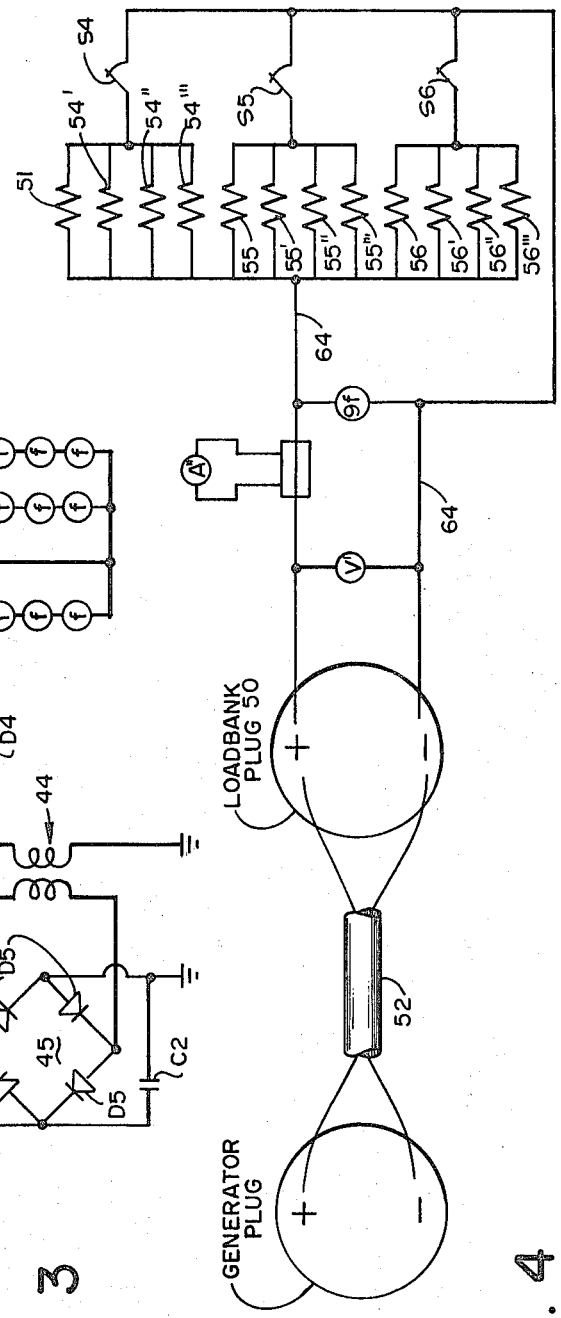
FIG. 4 is a circuit diagram of a load bank embodying principles of the invention in an alternative form.

With reference next to FIG. 4, an alternative embodiment of the invention is shown for use in testing a d.c. generator such as used as ground power for smaller aircraft. Here it is seen that the load bank includes a plug 50 having positive and negative terminals that are connected by a cable 52 with a generator plug which also has positive and negative terminals. Within the housing shown in FIG. 1 are mounted four coils 54–54''' in parallel that are connected by a switch S4 and a conductive line 64 across the plug terminals. Similarly, a second group of coils 55–55''' is connectable by a switch S5 in parallel across the plug terminals. A third group of resistance coils 56–56''' are connected by a switch S6 across the load bank plug terminals. Here the three switches are provided by a common rotary switch. An ammeter A'' is provided inductively coupled with connector line 64 while a voltmeter V''' is connected across the terminals. Nine fans 9f are also connected in parallel across the plug terminals.

In conducting a test on a d.c. generator the switch S4 is first closed causing the fans to be energized and the four coils 54–54''' to conduct current. The ammeter will then provide an indication of the current and the voltmeter V''' an indication of the voltage level. The load on the generator may then be increased by the closure of switch S5 placing the coils 55–55''' on line. Finally, the switch S6 may also be closed causing current also to flow through the third group of resistance coils 56–56'''. One set of values for the discrete components here are provided in the following table which should produce progressive ammeter readings of 400, 800 and 1,200 amps:

TABLE 2

| Resistors | |
|---|---|
| 54—54''' | ¼ ohm (each) |
| 55—55''' | ¼ ohm (each) |
| 56—56''' | ¼ ohm (each) |
| Fans | |
| f | 120 CFM 48 VDC (each) |

The load bank illustrated in FIGS. 1–3 has been found to work well with a Hobart Brothers Company of Troy, Ohio type 48 KW, 3 phase, 400 cycle, 200 volts a.c. generator for aircraft ground support service. By the unique use of low resistance coils, such as less than one ohm per individual coil or four ohms per group, in a compact housing that is air cooled by fans, and with the use of a half-duty cycle flow of a.c. current through the groups of low resistance coils, it has been possible to provide a portable unit which may provide sufficient load for such generators. The embodiment shown in FIG. 4 has also been found to work well with 1,300 amps, 28.5 VDC generators such as that also manufactured by Holbart.

It should be understood that the just described embodiments merely illustrated principles of the invention in selected forms. Many modifications, additions and deletions may, of course, be made thereto without departure from the spirit and scope of the invention as set forth in the following claims:

I claim:

1. A portable load bank for loading a generator during a generator test comprising, in combination, a housing; and electrical plug mounted to said housing and having a set of terminals; a plurality of electrically conductive coils mounted side by side within said housing in series circuit; switch means for electrically connecting said plurality of coils across at least two of said plug terminals; and electrically powered fan means coupled with said plug for circulating air through said housing in cooling said plurality of coils when conducting current while electrically connected across said two plug terminals by said switch means.

2. A portable load bank in accordance with claim 1 having an interlock circuit mounted within said housing that includes full wave rectifier means connected across two of said plug terminals.

3. A compact, lightweight, portable load bank for loading an a.c. generator during a generator test, and with the load bank comprising a housing to which first and second terminals are mounted, low resistance conductive means connected across said first and second terminals through a silicon controlled rectifier, and switch means for gating said silicon controlled rectifier on to cause the load bank to operate on a half-duty cycle by drawing current through the low resistance conductive means during one-half of the cycles of the a.c. generator output.

4. A portable load bank in accordance with claim 3 wherein said low resistance conductive means comprises a plurality of serially connected coils mounted side by side within said housing.

5. A portable load bank in accordance with claim 4 having electrically powered fan means coupled across said first and second terminals for circulating air through said housing in cooling said plurality of coils.

6. A portable load bank in accordance with claim 3 having third and fourth terminals mounted to said housing and an interlock circuit that includes full wave rectifier means connected across said third and fourth terminals.

7. A load bank for loading an a.c. generator during a generator test, and with the load bank comprising a housing to which a plug is mounted having first, second and third terminals; a first low resistance conductor mounted within said housing and electrically connected with said first terminal; a second low resistance conductor mounted within said housing and electrically connected with said second terminal; a third low resistance conductor mounted within said housing and electrically connected with said third terminal; and switching network means for selectively connecting together said first and second conductors through first unidirectional current carrying means, and said second and third conductors through second unidirectional current carrying means, and said first and third conductors through third unidirectional current carrying means, whereby the generator may be loaded at three discrete levels with the full load level being on a full duty cycle basis.

8. A load bank in accordance with claim 7 wherein said switching network means includes a first silicon controlled rectifier connected between said first and second conductor, a second silicon controlled rectifier connected between said second and third conductors, and a third silicon controlled rectifier connected between said first and third conductors.

9. A load bank in accordance with claim 8 comprising switch means for individually gating on and off each of said silicon controlled rectifiers.

10. A load bank in accordance with claim 7 wherein said plug has fourth and fifth terminals, and further comprising interlock circuit means for producing a d.c. voltage across said fourth and fifth terminals whenever an a.c. voltage is across said first terminal and ground.

11. A load bank in accordance with claim 7 wherein each of said low resistance conductors comprises a coil and wherein said coils are mounted in a row within said housing.

12. A load bank in accordance with claim 11 comprising electrically powered fan means mounted to said housing for cooling said coils.

* * * * *